(12) United States Patent
Matsudai et al.

(10) Patent No.: US 8,067,801 B2
(45) Date of Patent: Nov. 29, 2011

(54) SEMICONDUCTOR DEVICE AND METHOD OF MANUFACTURING THE SAME

(75) Inventors: Tomoko Matsudai, Tokyo (JP); Norio Yasuhara, Kawasaki (JP); Manji Obatake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 654 days.

(21) Appl. No.: 12/181,692

(22) Filed: Jul. 29, 2008

(65) Prior Publication Data
US 2009/0032869 A1    Feb. 5, 2009

(30) Foreign Application Priority Data
Jul. 30, 2007    (JP) ................. 2007-197398

(51) Int. Cl.
*H01L 29/735*    (2006.01)
(52) U.S. Cl. ......... 257/336; 257/E29.256; 257/E21.417; 438/217
(58) Field of Classification Search .......... 257/336, 257/E29.256, E21.417; 438/217
See application file for complete search history.

(56) References Cited

U.S. PATENT DOCUMENTS

| | | | |
|---|---|---|---|
| 7,005,336 B2 | 2/2006 | Moscatelli et al. | |
| 7,148,552 B2 | 12/2006 | Fujio et al. | |
| 2006/0017103 A1 | 1/2006 | Szelag | |
| 2006/0105528 A1 | 5/2006 | Cho et al. | |
| 2006/0141714 A1* | 6/2006 | Lee | ................. 438/275 |
| 2006/0255369 A1 | 11/2006 | Kim et al. | |
| 2007/0034985 A1 | 2/2007 | Matsudai et al. | |
| 2007/0040216 A1 | 2/2007 | Matsudai et al. | |

FOREIGN PATENT DOCUMENTS

| | | |
|---|---|---|
| JP | 2004-349372 | 12/2004 |
| JP | 2004-349377 | 12/2004 |

* cited by examiner

*Primary Examiner* — Thao Le
*Assistant Examiner* — Tanika Warrior
(74) *Attorney, Agent, or Firm* — Oblon, Spivak, McClelland, Maier & Neustadt, L.L.P.

(57) ABSTRACT

A semiconductor device is provided, which comprises a first transistor and a second transistor formed in a semiconductor layer. The first transistor includes a first source region and a first drain region sandwiching a first gate electrode with the first source region. The second transistor includes an LDD region and a drift region sandwiching the second gate electrode with the LDD region, and a second drain region adjacent to the drift region to sandwich the second gate electrode with the second source region. The first gate electrode has a first sidewall formed on sides thereof and the second gate electrode has a second sidewall formed on sides thereof. The width of the former along the first insulator differs from the width of the latter along the second insulator.

12 Claims, 19 Drawing Sheets

SEMICONDUCTOR DEVICE AND METHOD OF MANUFACTURING THE SAME

CROSS-REFERENCE TO RELATED APPLICATION

This application is based upon and claims the benefit of priority from prior Japanese Patent Application No. 2007-197398, filed on Jul. 30, 2007, the entire contents of which are incorporated herein by reference.

BACKGROUND OF THE INVENTION

1. Field of the Invention

The present invention relates to a semiconductor device and method of manufacturing the same, and more particularly to a structure of CMOS transistors and power MOS transistors and method of manufacturing the same.

2. Description of the Related Art

There have been well known CMOS (Complementary MOS) transistors, each of which is composed of a PMOS transistor and an NMOS transistor. In most of the CMOS transistors, the gate drive voltage is equal to the breakdown voltage, that is, a voltage applicable to the drain when reverse-biased.

On the other hand, a drift region may be formed in the CMOS transistor for achieving a middle/higher breakdown voltage. In addition, a lower gate drive voltage than the breakdown voltage may be applied to control the device. This is effective to achieve enhanced device performances, lowered power, lowered parasitic capacities and lowered on-resistances for achieving faster switching. For that purpose, there have been developed power MOS transistors such as a DMOS (Double diffused MOS) transistor. The power MOS transistor is operative to deplete the drift region to ensure the breakdown voltage.

In recent years, fine processes and fine design rules similar to those for the CMOS transistors, such as a 0.35 μm-rule and a 0.18 μm-rule, have been applied increasingly to the power MOS transistors as well. The application of fine design rules leads to realization of short-channel power MOS transistors and low-voltage-driven power MOS transistors. In such the case, circuitry designs of fine CMOS transistors and power MOS transistors both formed in one chip may be achieved possibly.

On the other hand, as each region becomes finer, a mask misalignment influences more seriously. In a fine process, a mask alignment with high accuracy to meet the requirement must be executed. Nevertheless, it is impossible to eliminate mask misalignments completely. Therefore, finer designs may increase the regions influenced by the mask alignment accuracy. For example, the more design margin needs to be estimated.

There has been devised a low-breakdown voltage power MOS transistor in which a drift region is formed through ion implantation with a mask of a sidewall formed around the gate electrode. In this case, a sidewall thickness of about 0.2 μm (that is, a lateral width of the sidewall) may be required to hold a 5V static breakdown voltage. A drift region having such the length is depleted to ensure the breakdown voltage of the device.

On the other hand, when a conventional method is used to manufacture a semiconductor device comprising CMOS transistors and power MOS transistors in one substrate, the thickness of the sidewall in the power MOS transistor is made equal to the thickness of the sidewall in the CMOS transistor. The sidewall thickness in the CMOS transistor may be applied to the power MOS transistor as it is. In such the case, however, as thin a CMOS sidewall thickness as about 0.1 μm can not achieve a desired static breakdown voltage and causes a restraint on structural designs.

Conventional technologies for forming two types of semiconductor devices having different sidewall thicknesses in combination on the same substrate include one that forms high-breakdown voltage CMOS transistors and low-breakdown voltage CMOS transistors at the same time (for example, JP 2004-349377A).

There is another technology of forming PMOS transistors and NMOS transistors having different sidewall thicknesses in combination on the same substrate (for example, JP 2004-349372A).

However, the method of forming CMOS transistors and low-breakdown voltage power MOS transistors in one substrate needs more progress and developments.

SUMMARY OF THE INVENTION

In an aspect the present invention provides a semiconductor device, comprising a first transistor and a second transistor formed in a semiconductor layer, said first transistor including: a first gate electrode formed on said semiconductor layer via a first insulator; a first source region formed in said semiconductor layer in relation to said first gate electrode; and a first drain region formed in said semiconductor layer to sandwich the first gate electrode with said first source region, said second transistor including: a second gate electrode formed on said semiconductor layer via a second insulator; a second source region formed in said semiconductor layer in relation to said second gate electrode; an LDD region formed in said semiconductor layer and adjacent to said second source region; a drift region formed in said semiconductor layer to sandwich said second gate electrode with said LDD region, the drift region having a lower impurity concentration than that of the LDD region; and a second drain region formed in said semiconductor layer and adjacent to said drift region to sandwich the second gate electrode with said second source region, wherein said first gate electrode has a first sidewall formed on sides thereof and said second gate electrode has a second sidewall formed on sides thereof, wherein the width of said first sidewall along said first insulator differs from the width of said second sidewall along said second insulator, and most part of said drift region is formed in a region under said second sidewall.

In another aspect the present invention provides a method of manufacturing semiconductor devices including a first transistor and a second transistor in a semiconductor layer, the method comprising: forming gate electrodes on said semiconductor layer; depositing a multi-layered insulator over the entire surface of said semiconductor layer; removing at least one layer of said multi-layered insulator through an isotropic etching in an area where said first transistor is to be formed; etching back at least one layer of said multi-layered insulator through a first anisotropic etching in an area where said second transistor is to be formed; and etching back the remainder of said multi-layered insulator through a second anisotropic etching.

DETAILED DESCRIPTION OF THE EMBODIMENTS

The embodiments associated with the semiconductor device according to the present invention will now be described in detail with reference to the drawings.

First Embodiment

Figure 1:
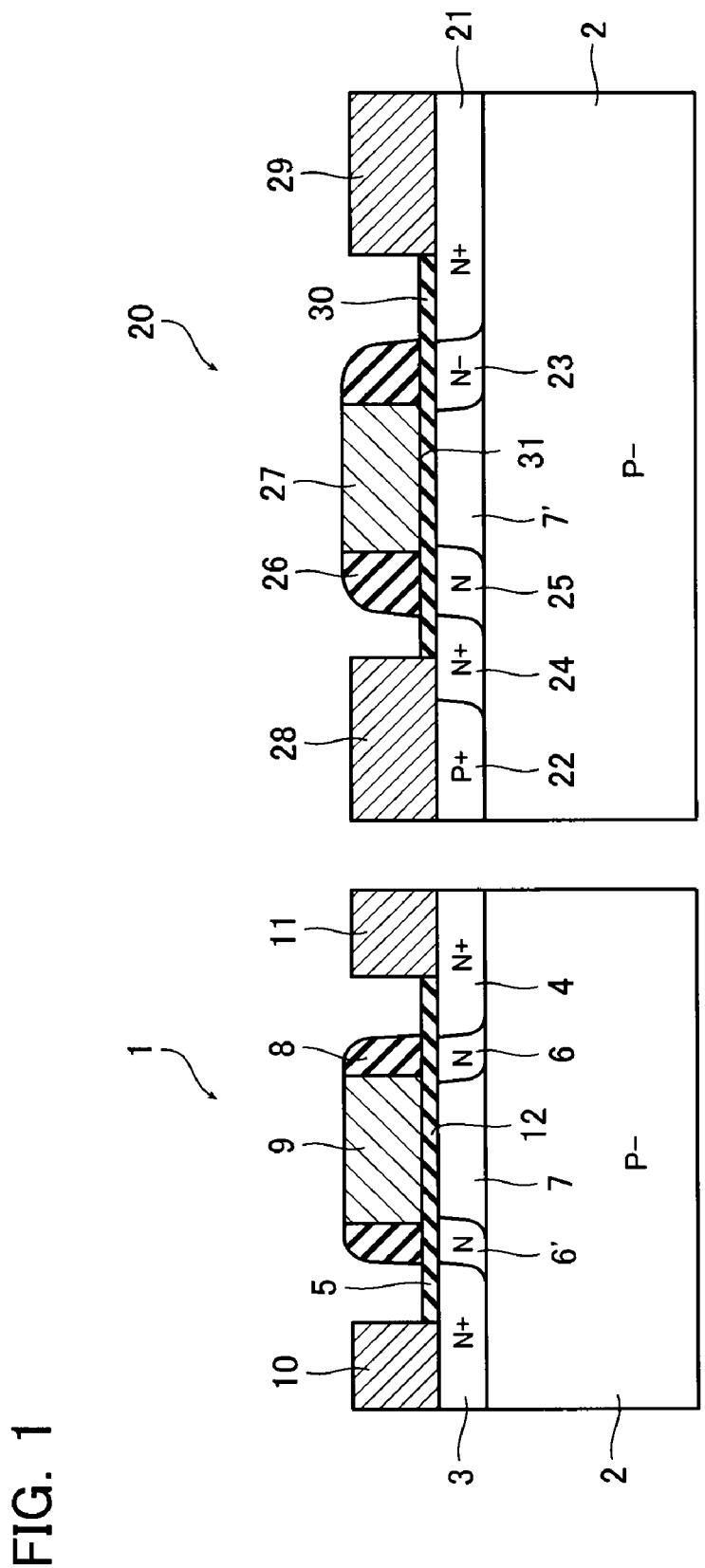
FIG. 1 briefly shows a structural cross-sectional view of a semiconductor device according to a first embodiment of the present invention.

FIG. 1 briefly shows a structural cross-sectional view of a semiconductor device according to the present embodiment, which comprises a CMOS transistor and a low-breakdown voltage power MOS transistor formed in combination on the same substrate.

FIG. 1 shows a structural cross-sectional view of a CMOS transistor portion on the left-hand side thereof, and a structural cross-sectional view of a power MOS transistor portion on the right-hand side thereof. The present embodiment is described by way of both N-type MOS transistors. The present embodiment describes the first conductivity type as P-type and the second conductivity type as N-type in a non-limiting example and this relation may be opposite. The power MOS transistor is described to mean a low-breakdown voltage power MOS transistor having a static breakdown voltage of around 5-10 V unless any special note is given hereinafter.

A structure of the CMOS transistor is described first with reference to FIG. 1. The CMOS transistor 1 is formed in a P$^-$-type high-resistance semiconductor layer 2 (first area). The P$^-$-type semiconductor layer 2 may be either a P$^-$-type substrate or a P-type well formed on a silicon substrate.

The CMOS transistor 1 has a gate electrode 9, which is selectively formed on the P$^-$-type semiconductor layer 2 via an insulator 5. A P-type semiconductor region or channel region 7 is formed in the P$^-$-type semiconductor layer beneath the gate electrode 9. The channel region 7 forms an inverted layer when a drive voltage higher than the threshold voltage is applied to the gate electrode 9. N-type semiconductor regions or N-type LDD regions 6, 6' are formed on both sides of the channel region 7. The LDD (Lightly Doped Drain) regions are formed with an impurity doped at a lower concentration than a source region 3 and a drain region 4 described later. Formed on the far side of the LDD region 6 laterally from the gate electrode 9 is a source region 3, which is an N$^+$-type semiconductor region including impurity ions doped at a higher concentration than the LDD region 6. Formed on the opposite side of the gate electrode 9 from the source region 3 is a drain region 4, which is an N$^+$-type semiconductor region including an impurity doped at a higher concentration than the LDD regions 6, 6'.

The insulator 5 may be formed of a silicon oxide. The insulator 5 has a portion formed below the gate electrode 9, which configures a gate oxide 12 in the MOS transistor. The gate oxide 12 is formed with a desired thickness in accordance with the gate drive voltage. The gate electrode 9 is formed on the gate oxide 12. The gate electrode 9 may be composed of conductive polysilicon selectively formed. A sidewall 8 is formed on sides of the gate electrode 9. As described in detail below, the sidewall 8 may include a silicon oxide and a silicon nitride deposited in turn. The insulator 5 has contact holes selectively opened therethrough such that a source electrode 10 and a drain electrode 11 are formed in the openings.

As for the CMOS transistor 1, for example, in the case of a 5V CMOS transistor, both the breakdown voltage and the gate drive voltage are equal to 5 V. Therefore, when a reverse bias of around 5 V is applied across gate-drain, a voltage higher than 5 V can not be applied to the gate oxide 12. In the CMOS transistor 1, the impurity concentrations and lateral dimensions of the LDD regions 6, 6' are laterally symmetrical about the channel region 7, and the lateral dimensions of the source 3 and drain 4 regions are laterally symmetrical about the channel region 7 as well.

A structure of the power MOS transistor is described next with reference to FIG. 1. The power MOS transistor 20 is formed in the same P⁻-type semiconductor layer 2 as the CMOS transistor 1, but in different area in the semiconductor layer 2(second area) from that where the above-described CMOS transistor 1 is formed. The P⁻-type semiconductor layer 2 may be either a P⁻-type substrate or a P-type well formed on a silicon substrate.

The power MOS transistor 20 has a gate electrode 27, which is selectively formed on the P⁻-type semiconductor layer 2 with an insulator 30 sandwiched therebetween. A P-type semiconductor region or channel region 7' is formed in the P⁻-type semiconductor layer beneath the gate electrode 27. The channel region 7' forms an inverted layer when a drive voltage higher than the threshold voltage is applied to the gate electrode 27. Formed on the left-hand side (source side) of the channel region 7' is a LDD region 25, which is an N-type diffused region including an impurity doped at a lower concentration than a source region 24 described later. Formed on the right-hand side (drain side) of the channel region 7' is a drift region 23. The drift region 23 sandwiches the gate electrode 27 with the LDD region 25. The drift region 23 include an impurity doped at a lower concentration than the LDD region 25. Therefore, the impurity-doped concentration in the LDD region 25 and the impurity-doped concentration in the drift region 23 are made asymmetrical laterally about the channel region 7. Formed on the far side of the LDD region 25 laterally from the gate electrode 27 is a source region 24, which is a high-concentration N⁺-type diffused region including an impurity doped at a higher concentration than the LDD region 25. Formed on the far side of the source region 24 laterally from the gate electrode 27 is a contact region 22, which is a high-concentration P⁺-type diffused region including an impurity doped at a higher concentration than the semiconductor layer 2. Formed on the far side of the drift region 23 laterally from the gate electrode 27 is a drain region 21, which is a high-concentration N⁺-type diffused region including an impurity doped at a higher concentration than the drift region 23.

The insulator 30 may be formed of a silicon oxide. The insulator 30 has a portion formed below the gate electrode 27, which configures a gate oxide 12 in the MOS transistor. A gate oxide 31 is formed on the surface of the P⁻-type semiconductor layer 2. The gate oxide 31 may be formed with a desired thickness in accordance with the gate drive voltage. In the case of a low-breakdown voltage power MOS transistor 20, the gate drive voltage is usually designed lower than the equal breakdown voltage CMOS transistor and the gate oxide 31 is designed thinner. A gate oxide 27 is formed on the gate oxide 31. The gate oxide 27 may be composed of conductive polysilicon selectively formed.

A sidewall 26 is formed on sides of the gate electrode 27. As described in detail below, the sidewall 26 may include a silicon oxide, a silicon nitride and a silicon oxide deposited in turn. The insulator 30 has contact holes selectively opened therethrough such that a source electrode 28 and a drain electrode 29 are formed in the openings. The source electrode 28 is connected with the source region 24 and the contact region 22 in common.

Figure 2:
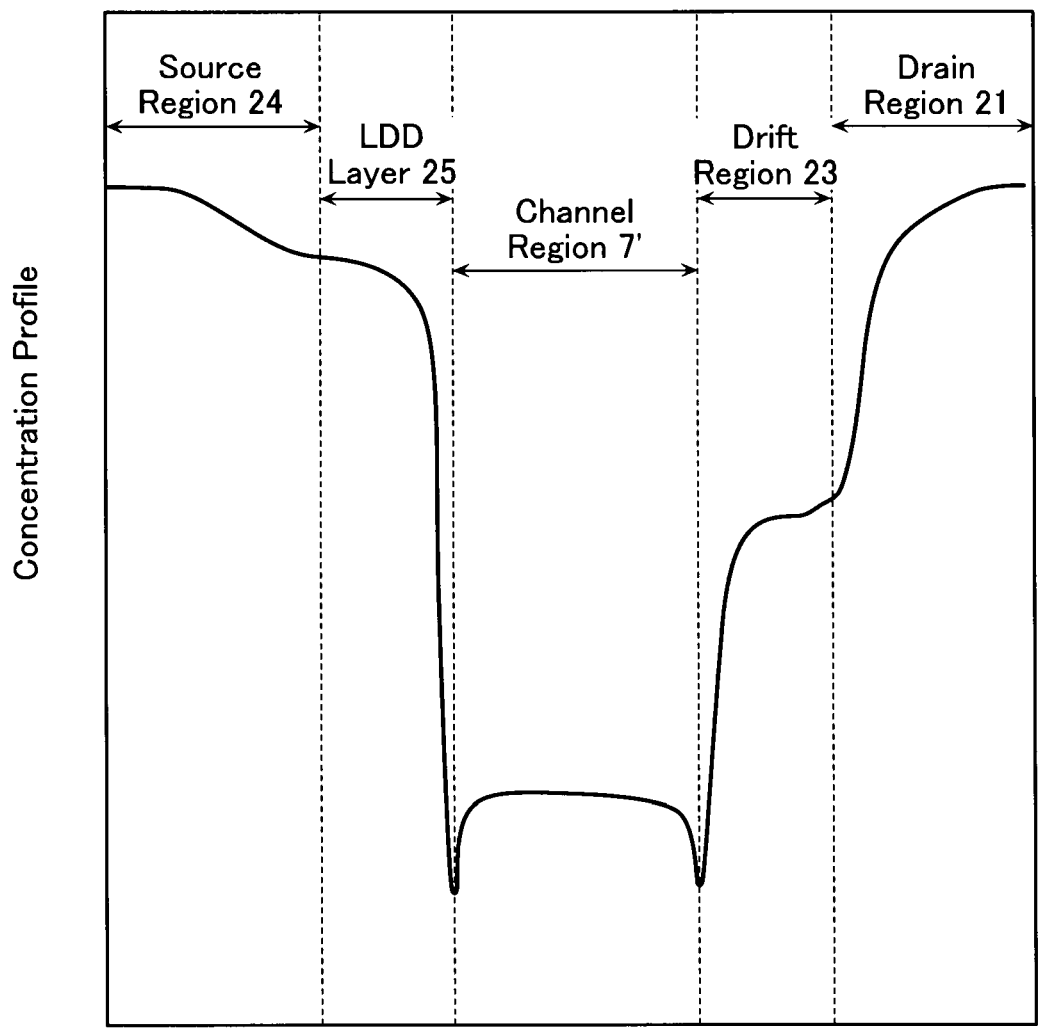
FIG. 2 shows an impurity concentration profile in the lateral direction in a device surface of a power MOS transistor according to the first embodiment of the present invention.

As described above, in the power MOS transistor 20, the impurity dose in the LDD region 25 and the impurity dose in the drift region 23 are not laterally symmetrical about the channel region 7'. This point is described in detail with reference to the drawings. FIG. 2 generally shows a concentration profile in the lateral direction in the device surface of the power MOS transistor 20. The lateral concentration profile is designed such that the impurity-doped concentration in the drift region 23 is lower than the impurity-doped concentration in the LDD region 25 on the opposite side of the channel region 7'. Specifically, the impurity dose in the LDD region 25 is around $10^{14}$ cm$^{-2}$ and the impurity dose in the drift region 23 is around $10^{13}$ cm$^{-2}$. The impurity dose in the drift region 23 thus made lower than that in the LDD region 25 close to the source can deplete the drift region 23 when a reverse bias is applied across source-drain, thereby keeping the lateral breakdown voltage of the device. Further, the drift region 23 is required to have a length made longer in accordance with the breakdown voltage. For example, a 5V LDMOS requires a drift length of around 0.2 μm.

Therefore, combination of CMOS transistors and power MOS transistors different in breakdown voltage and property embedded in the same substrate requires formation of a drift region in power MOS transistors different in length from CMOS transistors (a LDD region in CMOS transistors).

As described in detail below, in the present embodiment, the sidewalls 8, 26 are used as masks to form the source region 3 and the drain region 4 and the source region 24 and the drain region 21. In this case, without suffering the influence of mask misalignments, the LDD regions 6 and 6' in the CMOS transistor 1 and the LDD region 25 and the drift region 23 in the power MOS transistor 29 can be formed such that the lengths thereof are kept at desired distances. Specifically, most part of the LDD regions 6, 6', the LDD region 25 and the drift region 23 are all formed in regions under the sidewalls 8 or 26. Therefore, the lengths of the LDD regions 6, 6', the LDD region 25 and the drift region 23 are determined by the width of the sidewall 8 and 26. This configuration allows two types of different breakdown-voltage devices to be embedded on the same substrate in combination while keeping flexibility of design.

In the present embodiment, the sidewalls 8, 26 are formed of multi-layered insulators. The multi-layered insulator in question herein comprises at least one first insulator (such as silicon oxide) and second insulator (such as silicon nitride) in combination. Specifically, a silicon oxide with a certain thickness and a silicon nitride with a certain thickness, laterally extending, are deposited on the sides of the gate electrode 9 in turn from below as the sidewall 8. On the other hand, a silicon oxide with a certain thickness, a silicon nitride with a certain thickness and a silicon oxide with a certain thickness, laterally extending, are deposited on the sides of the gate electrode 27 in turn from below as the sidewall 26. The sidewall 26 in the power MOS transistor 20 may be formed thicker by one layer of silicon oxide than the sidewall 8 in the CMOS transistor 1. This point is described in detail below. In the present embodiment, the sidewall 8 can be designed different in thickness from the sidewall 26. Thus, the LDD region 25 and the drift region 23 in the power MOS transistor can be made larger in lateral dimension than the LDD regions 6 and 6' in the CMOS transistor. The thickness of the sidewall (the width of the lower end portion of the sidewall) is herein defined as the width along the upper surface of the insulator 5 or the insulator 30. The following embodiments also apply the same definition.

The following description is given to a method of manufacturing the semiconductor device according to the present embodiment, which comprises CMOS transistors and power MOS transistors formed in combination on the same substrate. FIGS. 3A-3K show part of the manufacturing process, from which the annealing process is omitted for convenience in describing.

Figure 3A:
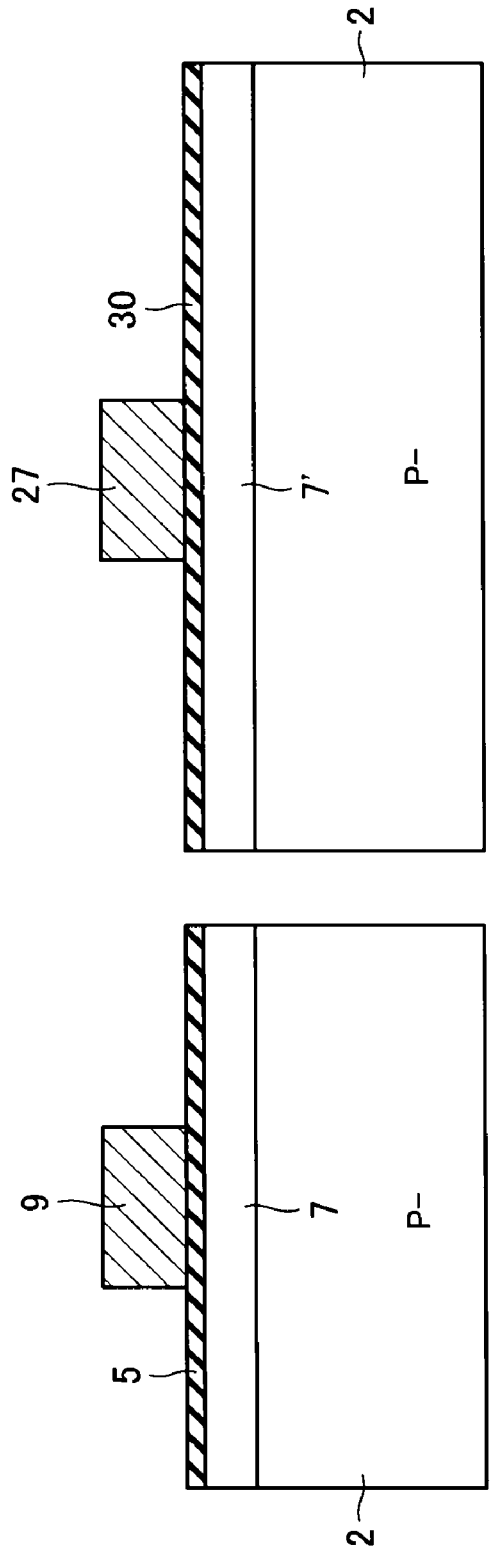
FIG. 3A is a brief cross-sectional view illustrative of the process for manufacturing the semiconductor device according to the first embodiment of the present invention.

First, at step 1, a process of certain impurity ion implantation is applied to form the channel regions 7, 7' in the P$^-$-type semiconductor layer 2 as shown in FIG. 3A. Next, the insulators (such as silicon oxide films) 5, 30 are formed, which are turned into the gate oxides. In the CMOS transistor area and the power MOS transistor area, the insulators 5, 30 may be either identical or different in thickness in accordance with the gate drive voltage. Photolithography and etching processes are applied to selectively form polysilicon on the insulators 5, 30, which are turned into the gate electrodes 9, 27.

Figure 3B:
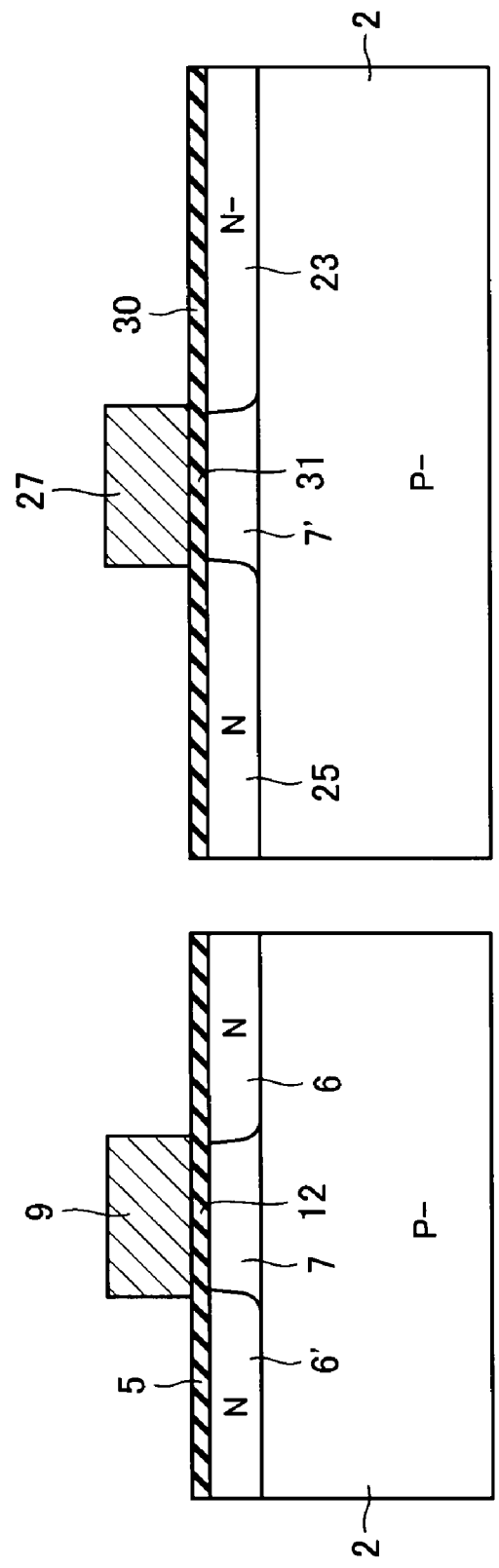
FIG. 3B is a brief cross-sectional view illustrative of the process for manufacturing the semiconductor device according to the first embodiment of the present invention.

Then, at step 2, a process of desired ion implantation is applied in a self-aligned manner with respect to the gate electrode 9 in the CMOS transistor 1 to form an impurity-diffused region with a lower concentration than the source region 3 as shown in FIG. 3B. Specifically, ions of phosphorous (P) or the like are implanted into the substrate at implantation energy of 50-70 KeV and a dose of around $10^{14}$ cm$^{-2}$. Thus, the LDD regions 6, 6' in the CMOS transistor 1 are formed.

At the same time, a process of desired ion implantation is applied in a self-aligned manner with respect to the gate electrode 27 in the power MOS transistor 20 to form an impurity-diffused region with a lower concentration than the source region 24 only on the source side.

Specifically, with a mask of photoresist having an aperture at the left-hand side (source side) of the gate electrode 27 and the CMOS transistor area, ions of phosphorous (P) or the like are implanted into the substrate at implantation energy of 50-70 KeV and a dose of around $10^{14}$ cm$^{-2}$. Thus, the impurity-diffused region with a lower concentration than the source region 24 can be formed simultaneously as the LDD region 25 in the power MOS transistor 20, and the LDD regions 6, 6' in the CMOS transistor 1.

Next, with a mask of photoresist having an aperture at the right-hand side (drain side) of the gate electrode 27, ions of phosphorous (P) or the like are implanted into the substrate at implantation energy of 50-70 KeV and a dose of around $10^{13}$ cm$^{-2}$. Thus, the impurity-diffused region with a lower concentration than the LDD region 25, or the drift region 23 can be formed.

Figure 3C:
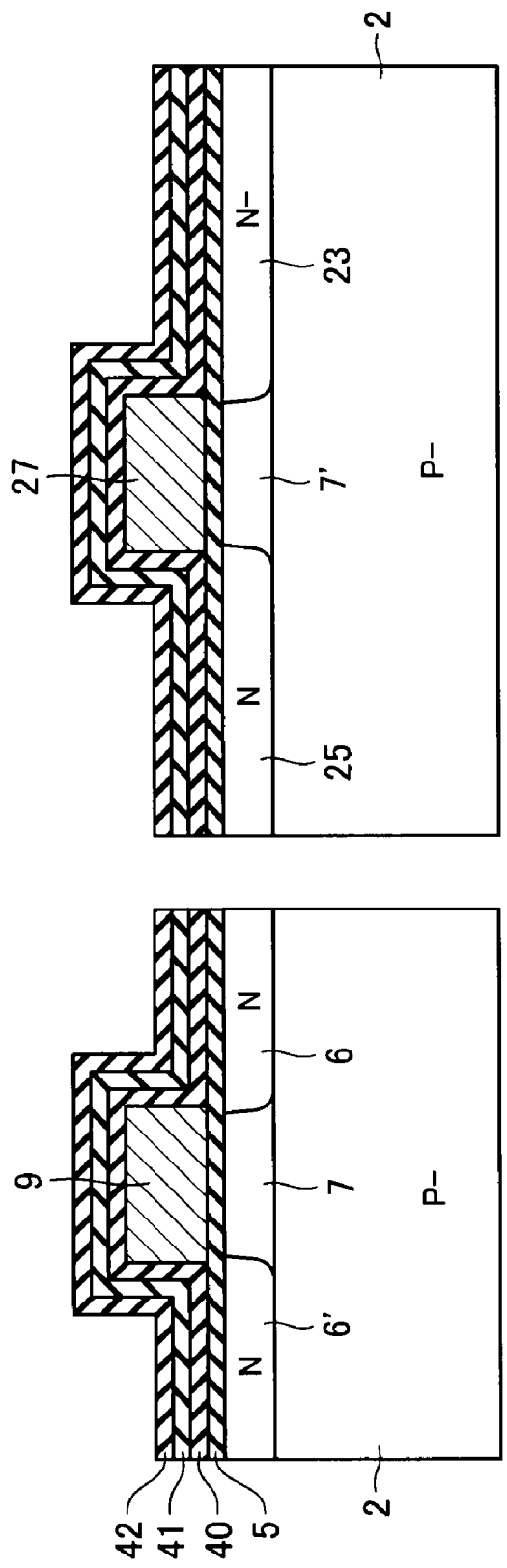
FIG. 3C is a brief cross-sectional view illustrative of the process for manufacturing the semiconductor device according to the first embodiment of the present invention.

Then, at step 3, a silicon oxide 40 with a certain thickness, a silicon nitride 41 with a certain thickness and a silicon oxide 42 with a certain thickness may be deposited in turn over the substrate as shown in FIG. 3C. These insulators can be deposited through a process of thermal CVD or plasma CVD. The film thickness may be set at a desired thickness of from several nm to several 100 nm.

Figure 3D:
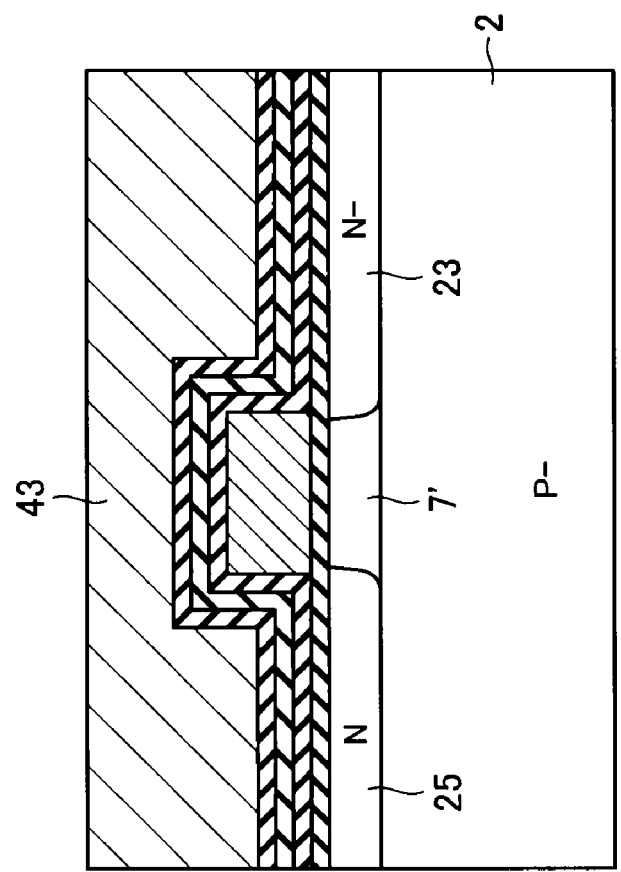
FIG. 3D is a brief cross-sectional view illustrative of the process for manufacturing the semiconductor device according to the first embodiment of the present invention.
Figure 3D:
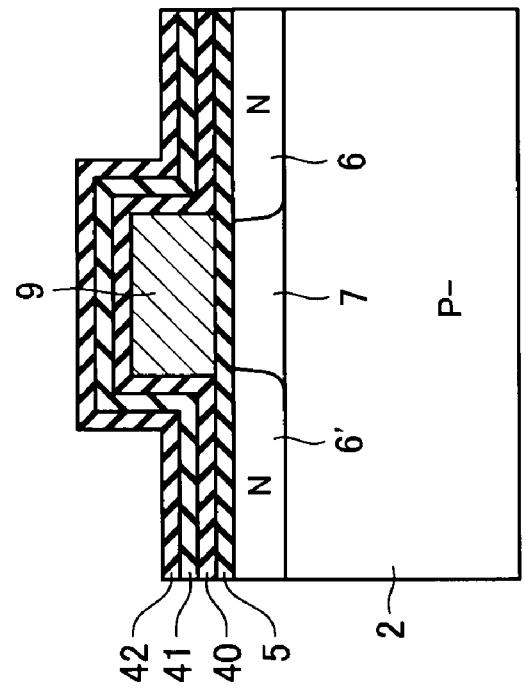

Next, at step 4, a photoresist is applied and a photolithography technology is used to form a mask 43 having an aperture over the CMOS transistor area as shown in FIG. 3D.

Figure 3E:
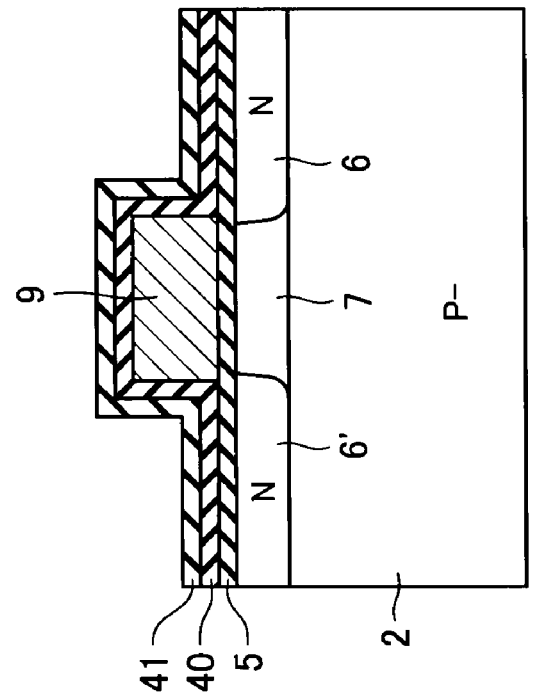
FIG. 3E is a brief cross-sectional view illustrative of the process for manufacturing the semiconductor device according to the first embodiment of the present invention.
Figure 3E:
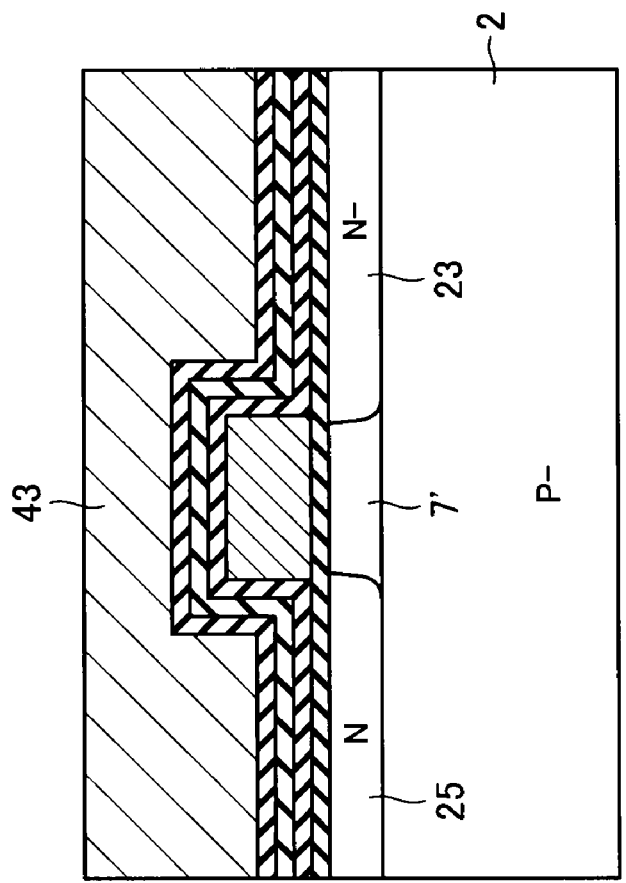

Subsequently, at step 5, the mask 43 is used to remove the insulator 42 from above the CMOS transistor 1 through a wet etching (isotropic etching) using a dilute hydrofluoric acid (HF) or an ammonium fluoride (NH$_4$F) as shown in FIG. 3E. The silicon nitride 41 serves as a stopper against the wet etchant (the hydrofluoric acid in this case). The mask 43 is then removed.

Figure 3F:
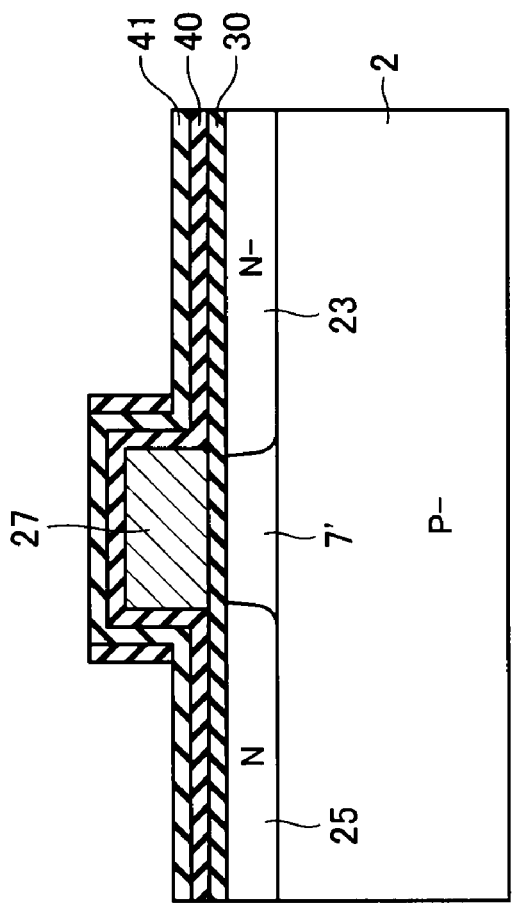
FIG. 3F is a brief cross-sectional view illustrative of the process for manufacturing the semiconductor device according to the first embodiment of the present invention.
Figure 3F:
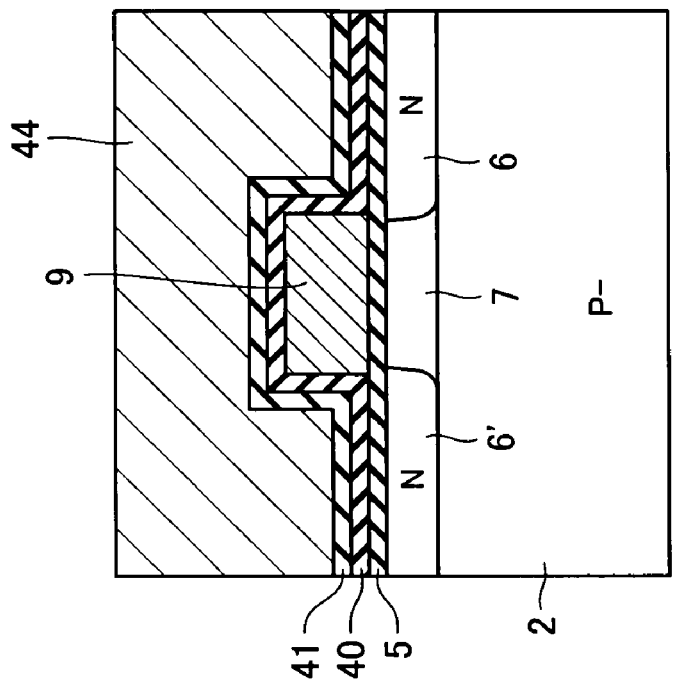

Next, at step 6, a photolithography technology is used to form a mask 44 having an aperture over the power MOS transistor 20 area as shown in FIG. 3F. The mask 44 is then used to etch back the insulator 42 in the power MOS transistor 20 area by dry etching (anisotropic etching) such as RIE (Reactive Ion Etching). In this case, the later-described property of RIE leaves the insulator 42 on the sides of the gate electrode 27. The mask 44 is then removed.

Figure 3G:
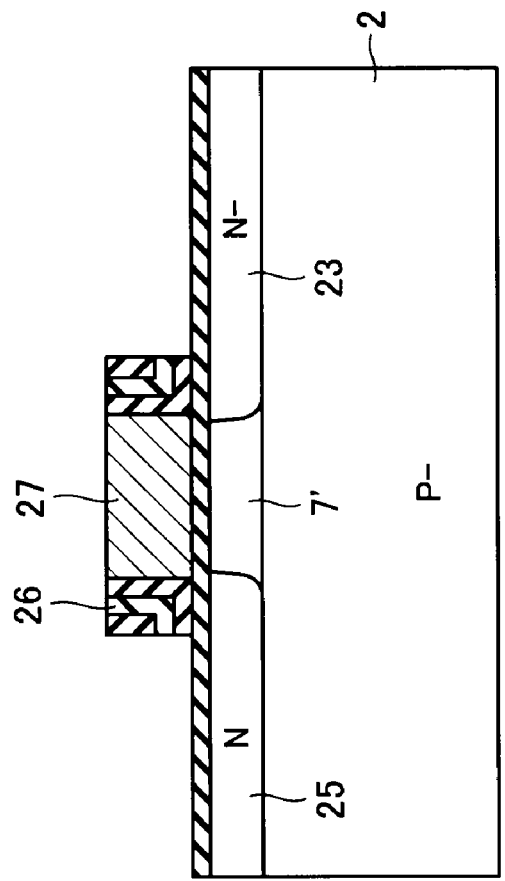
FIG. 3G is a brief cross-sectional view illustrative of the process for manufacturing the semiconductor device according to the first embodiment of the present invention.
Figure 3G:
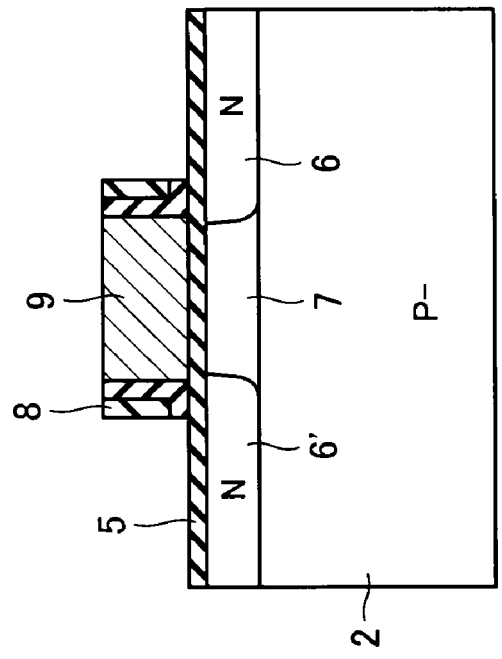

Subsequently, at step 7, a dry etching (anisotropic etching) such as RIE is applied to remove the silicon nitride 41 and the silicon oxide 40 in the CMOS transistor 1 area and the silicon nitride 41 and the silicon oxide 40 in the power MOS transistor 20 area as shown in FIG. 3G. The use of anisotropic etching causes a high etching rate in the direction normal to the substrate surface that develops etching and an extremely low etching rate in the direction parallel with the substrate surface that hardly develops etching. As a result, the silicon oxide and the silicon nitride are left only on the sides of the gate electrodes 9, 27, thereby forming the sidewalls 8, 26. The thicknesses of the sidewalls 8, 26 almost correspond to the thicknesses of the silicon oxide and nitride films subjected to anisotropic etching. As a result, the sidewalls 8 and 26 are formed on the gate electrodes 9 and 27, respectively. Namely, formed on the sides of the gate electrode 9 is the sidewall 8 having a thickness almost corresponding to the thicknesses of the silicon oxide 40 and the silicon nitride 41. In addition, formed on the sides of the gate electrode 27 is the sidewall 26 having a thickness almost corresponding to the thicknesses of the silicon oxide 40, the silicon nitride 41 and the silicon oxide 42.

Figure 3H:
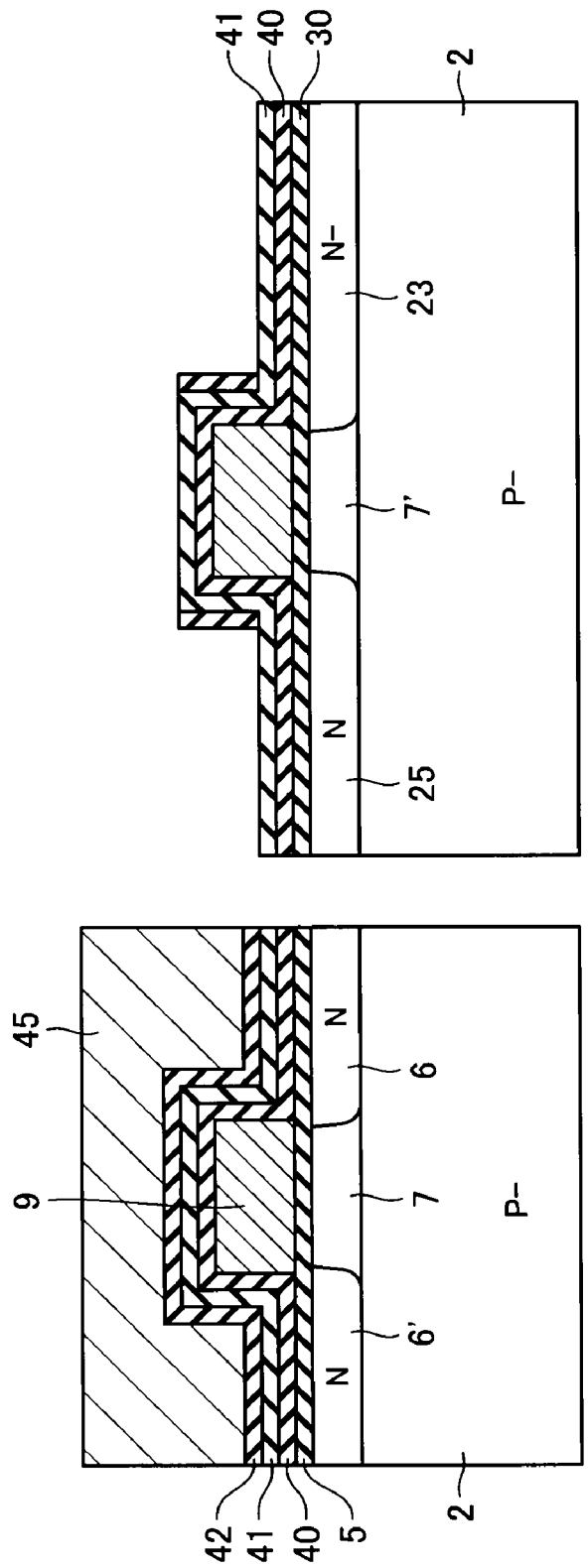
FIG. 3H is a brief cross-sectional view illustrative of the process for manufacturing the semiconductor device according to the first embodiment of the present invention.
Figure 3I:
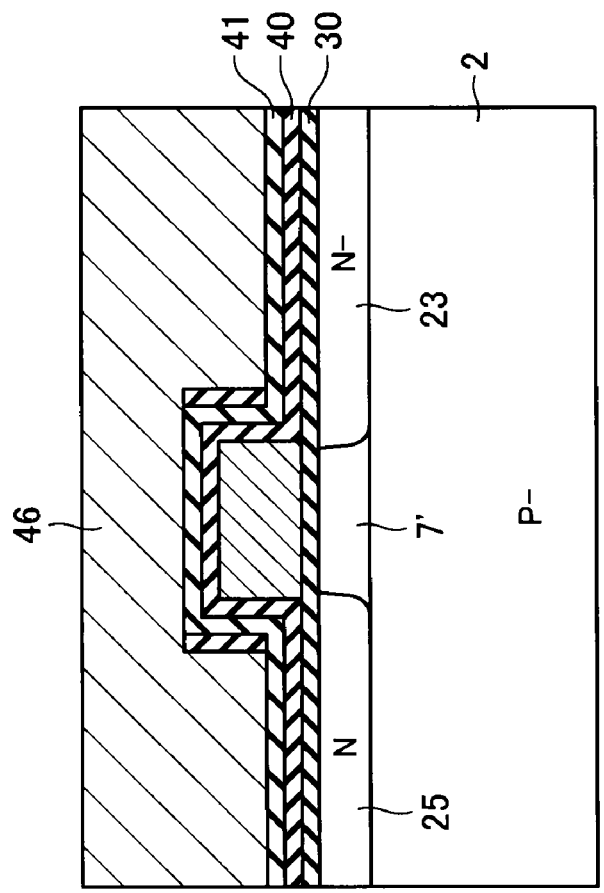
FIG. 3I is a brief cross-sectional view illustrative of the process for manufacturing the semiconductor device according to the first embodiment of the present invention.
Figure 3I:
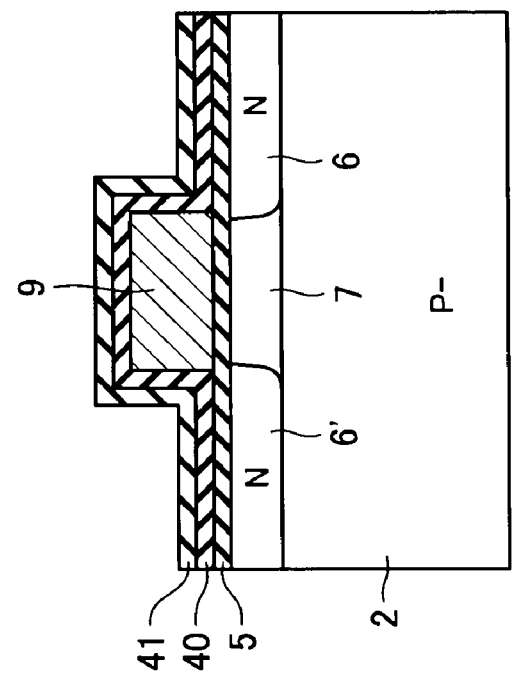

Referring to FIGS. 3H and 3I, another method of forming the sidewalls 8 and 26 with different thickness is described.

After the deposition of the silicon oxide 40, the silicon nitride 41 and the silicon oxide 42 as shown in FIG. 3C, a photoresist is applied as shown in FIG. 3H. A photolithography technology is then used to form a mask 45 having an aperture over the power MOS transistor 20 area. The mask 45 is then used to etch back the silicon oxide 42 in the power MOS transistor 20 area by dry etching (anisotropic etching) such as RIE. In this case, the use of anisotropic etching leaves the silicon oxide 42 only on the sides of the gate electrode 27 in the power MOS transistor 20 as described above.

Subsequently, a photoresist is applied and then a photolithography technology is used to form a mask 46 having an aperture over the power MOS transistor 20 area as shown in FIG. 3I. Next, a dilute hydrofluoric acid (HF) or an ammonium fluoride (NH$_4$F) is used to remove the silicon oxide 42 only from above the CMOS transistor 1 by wet etching. The silicon nitride 41 serves as a stopper against the wet etchant (the hydrofluoric acid in this case). The mask 46 is then removed.

Subsequently, a dry etching (anisotropic etching) such as RIE is applied to remove the silicon nitride 41 and the silicon oxide 40 in the CMOS transistor 1 area and the silicon nitride 41 and the silicon oxide 40 in the power MOS transistor 20 area as described above. As a result, the sidewalls 8 and 26 with different thickness are formed on the gate electrodes 9 and 27, respectively, as in the state of FIG. 3G.

Figure 3J:
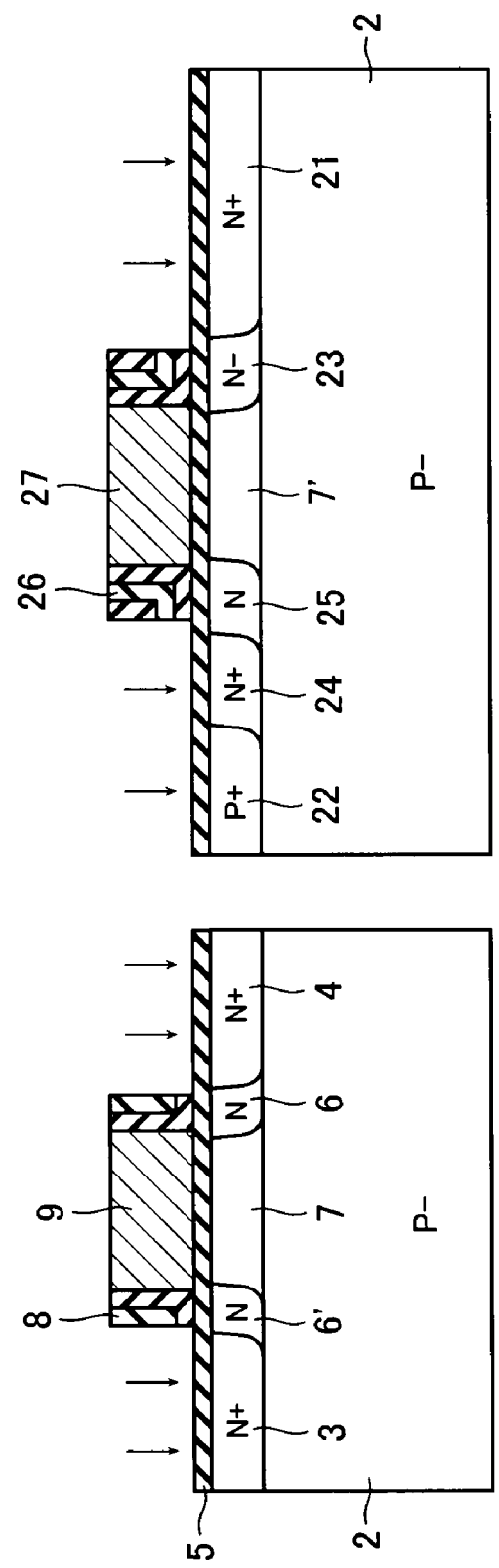
FIG. 3J is a brief cross-sectional view illustrative of the process for manufacturing the semiconductor device according to the first embodiment of the present invention.

Next, at step 8, both the CMOS transistor 1 and the power MOS transistor 20 are subjected to a process of ion implantation in a self-aligned manner with respect to the sidewalls 8, 26 used as a mask. As a result, impurity-diffused regions are formed at a higher concentration than the LDD regions 6, 6' as shown in FIG. 3J. The use of the sidewalls 8, 26 with different thickness prevents mask misalignments and improves flexibility of design. The n$^+$-dopant available in ion implantation may include arsenic (As). In such the case, the ion implantation is executed at 30-60 KeV and an ion dose of from 2.0× $10^{15}$ cm$^{-2}$ to 5.0×$10^{15}$ cm$^{-2}$. Thus, the N$^+$-type source region 3 and the N$^+$-type drain region 4 in the CMOS transistor 1 and the N$^+$-type source region 24 and the N$^+$-type drain region 21 in the power MOS transistor 20 can be formed at the same time.

A further process of ion implantation is executed to form the P$^+$-type contact region 22 selectively. The p$^{30}$-dopant available in ion implantation may include boron (B). In such the case, the ion implantation is executed at 5-40 KeV and an ion dose of from $2.0\times10^{14}$ cm$^{-2}$ to $5.0\times10^{15}$ cm$^{-2}$.

Figure 3K:
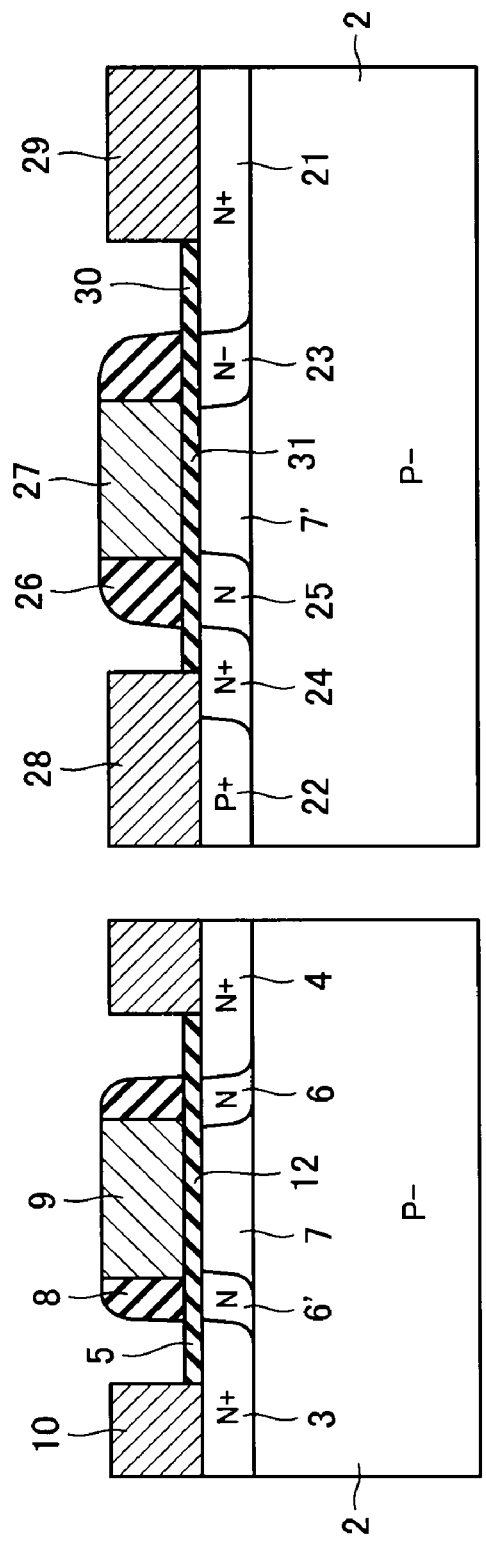
FIG. 3K is a brief cross-sectional view illustrative of the process for manufacturing the semiconductor device according to the first embodiment of the present invention.

Finally, at step 9, contact holes are opened through the insulators 5, 30 as shown in FIG. 3K, in which a tungsten (W) film is buried. Then, aluminum (Al) spattering or copper (Cu) plating is applied to form a metal layer. Thereafter, photolithography and etching processes are used to form the source electrode 10 and the drain electrode 11 in the CMOS transistor 1 and the source electrode 28 and the drain electrode 29 in the power MOS transistor 20 at the same time.

In accordance with the present embodiment, CMOS transistors and power MOS transistors can be formed in combination on the same substrate. In addition, the use of sidewalls as masks for forming source regions and drain regions reduces mask misalignments on formation of drift regions. The possibility of CMOS transistors and power MOS transistors formed with sidewalls having different thickness leads to formation of power MOS transistors with higher breakdown voltages than CMOS transistors. As a result, semiconductor devices comprising CMOS transistors and power MOS transistors in combination in one substrate can be improved in flexibility of design.

Figure 4:
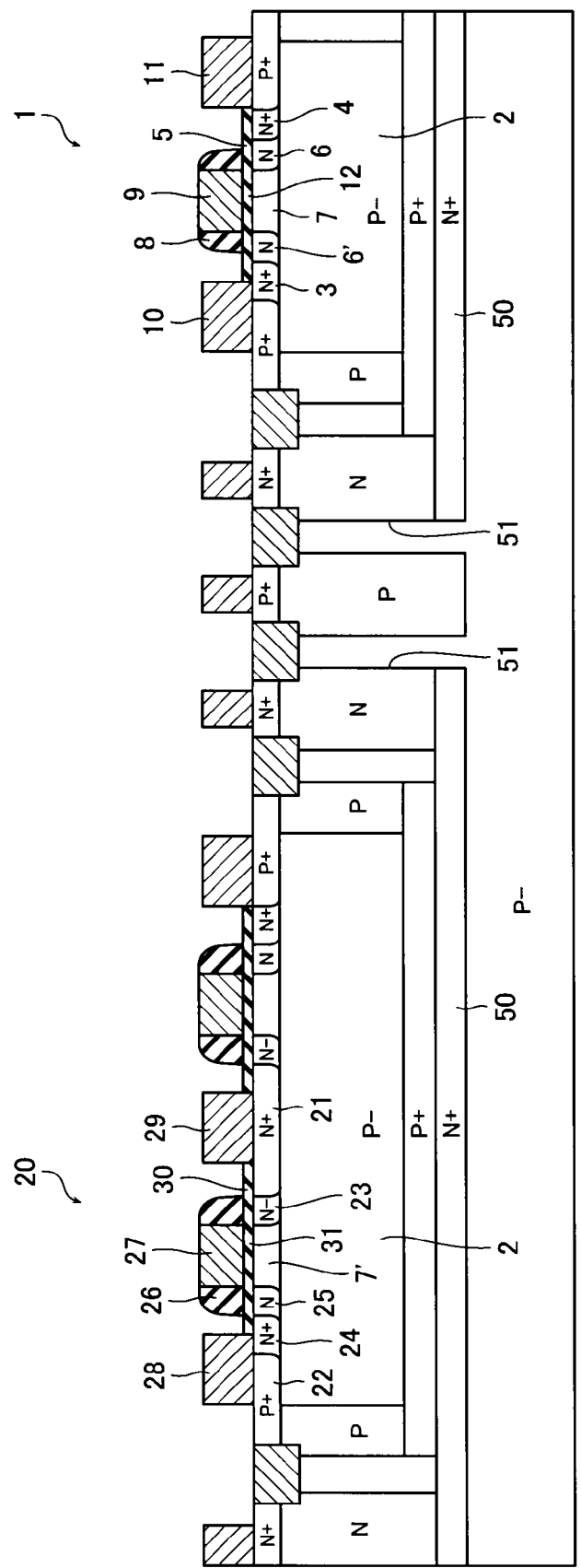
FIG. 4 briefly shows a sectioned structure of the semiconductor device according to the first embodiment of the present invention, which comprises a CMOS transistor and a power MOS transistor in one substrate.

FIG. 4 shows a structural cross-sectional view of the device actually formed in combination through the above-described manufacturing method. The CMOS transistor 1 and the power MOS transistor 20 are formed in the P$^-$-type semiconductor layer 2 (or P-well region), which are separated by an N$^+$-type layer 50 and an N-type layer 51 formed in depth, and thus formed separately on the same substrate. The method of separating the CMOS transistor 1 and the power MOS transistor 20 is not limited to this example.

Second Embodiment

Figure 5:
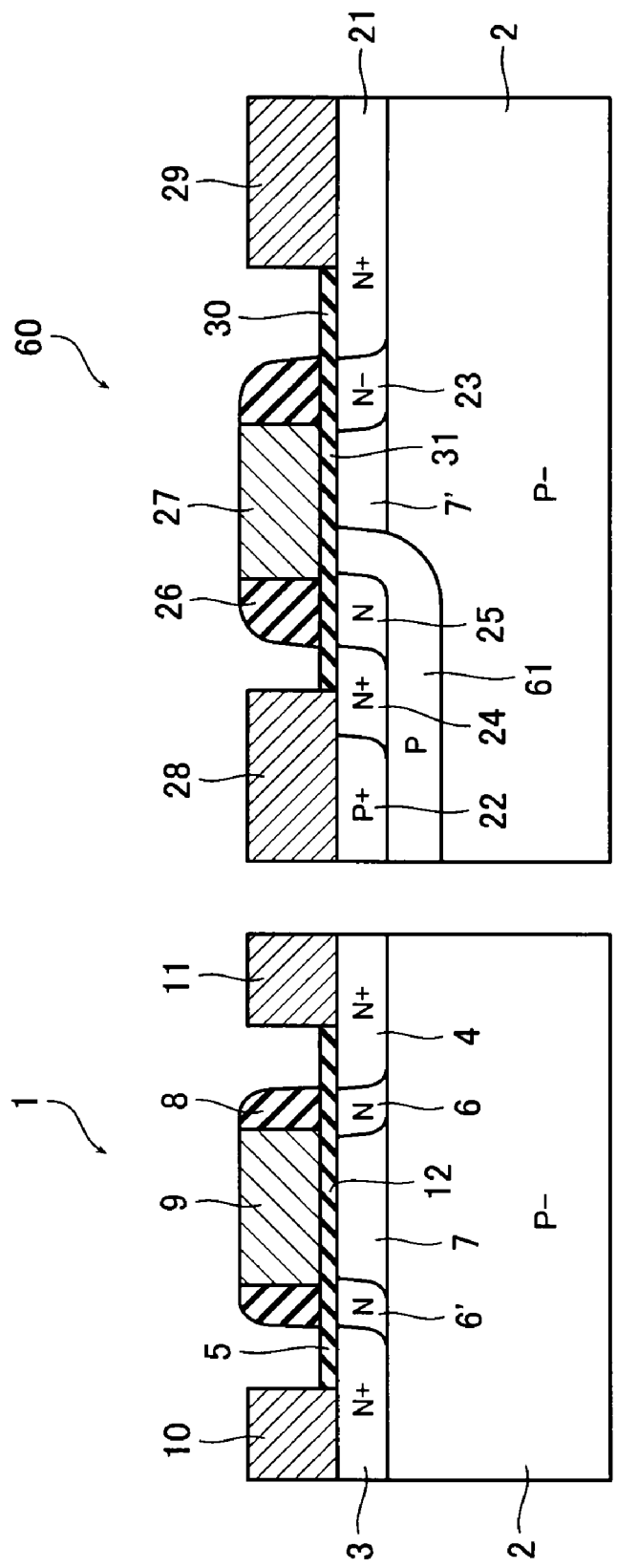
FIG. 5 briefly shows a structural cross-sectional view of a semiconductor device according to a second embodiment of the present invention.

FIG. 5 briefly shows a structural cross-sectional view of a semiconductor device according to the present embodiment. The CMOS transistor area is similar to that in the above-described first embodiment and accordingly omitted from the following description. The power MOS transistor 60 in the semiconductor device according to the present embodiment includes a P-type body region 61 in the P$^-$-type semiconductor layer 2, different from the power MOS transistor 20 in the above-described first embodiment. The P-type body region 61 is formed to surround the source-side contact region 22, the source region 24 and the LDD region 25 and partly extend to a portion below the gate oxide 31. Therefore, in the region below the gate oxide 31, the impurity concentration is higher on the drain-side than on the source-side. The impurity concentration in the P-type body region 61 has a peak, which locates much deeper than the surface of the semiconductor layer in which the source region 24 is formed.

The P-type body region 61 is mainly used to adjust the threshold of the power MOS transistor 60. In order to achieve a high source-drain breakdown voltage, the impurity concentration in the drift region 23 in the power MOS transistor 60 is set lower than that in the LDD region 6 in the CMOS transistor 1. The P-type well region formed in the entire area of the CMOS transistor 1 to adjust the threshold of the CMOS transistor 1 may be formed also in the entire area of the power MOS transistor 60. In such the case, though, the effective impurity concentration in the drift region 23 lowers undesirably. In place of the P-type well region, the P-type body region 61 is formed only on the source-side of the power MOS transistor 60 to adjust the threshold. If the P-type body region 61 overlaps the drift region 23, the effective impurity concentration in the drift region 23 lowers and the on-resistance increases undesirably. Therefore, the P-type body region 61 is formed only on the source-side below the gate insulator 31. In addition, the P-type body region 61 has an effect of suppressing punch-through.

A method of manufacturing the semiconductor device according to the present embodiment is described with reference to the drawings. FIG. 6 shows the steps of forming the P-type body region 61 in the power MOS transistor 60 according to the present embodiment.

As described in the first embodiment with FIG. 3A, a process of certain impurity ion implantation is applied to form the channel regions 7, 7' in the P$^-$-type semiconductor layer 2. Thereafter, the silicon oxide films 5, 30 are formed and then the gate electrodes 9, 27 are formed. The channel region 7' is not always required.

Figure 6A:
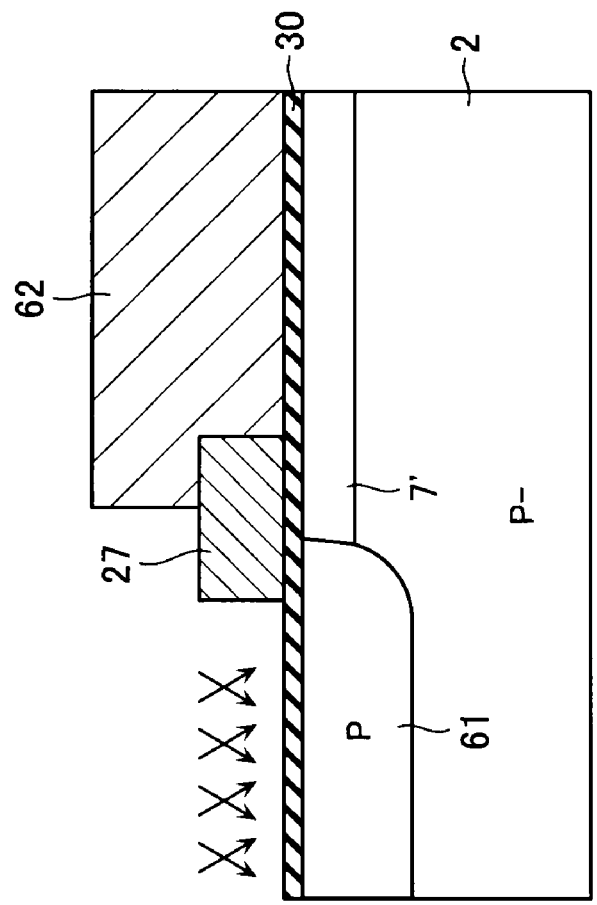
FIG. 6A is a brief cross-sectional view illustrative of the process for manufacturing the semiconductor device according to the second embodiment of the present invention.
Figure 6A:
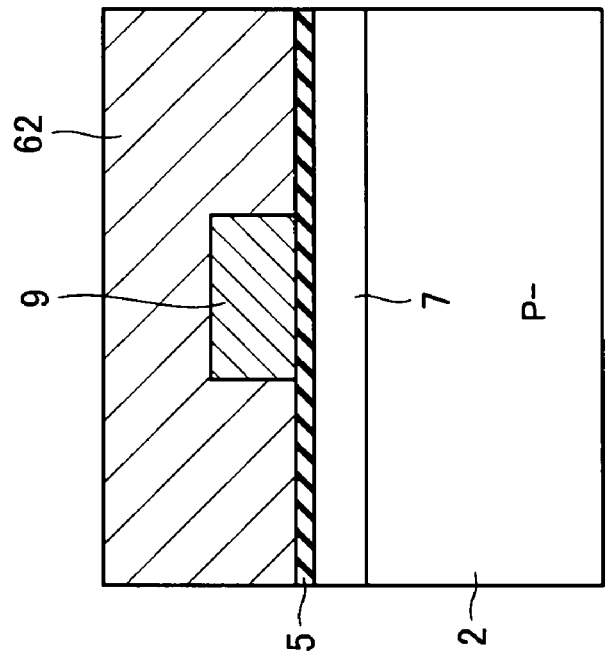

Next, at step 2, a photoresist is applied over the entire surface as shown in FIG. 6A, and a photolithography technology is used to form a mask 62 having an aperture only over the portion in which the P-type body region 61 is formed. With the use of the mask 62, ions of boron (B) or BF$_2$ are implanted slantingly from above, for example, at an incident angle or 30° or more. In such the case, the ion implantation is executed at 5-40 KeV and an ion dose of from $1.0\times10^{13}$ cm$^{-2}$ to $5.0\times10^{13}$ cm$^{-2}$. Through such the slanting ion implantation, ions can be implanted into a portion immediately beneath the gate electrode 27 to form the P-type body region 61. The mask 62 is then removed.

Figure 6B:
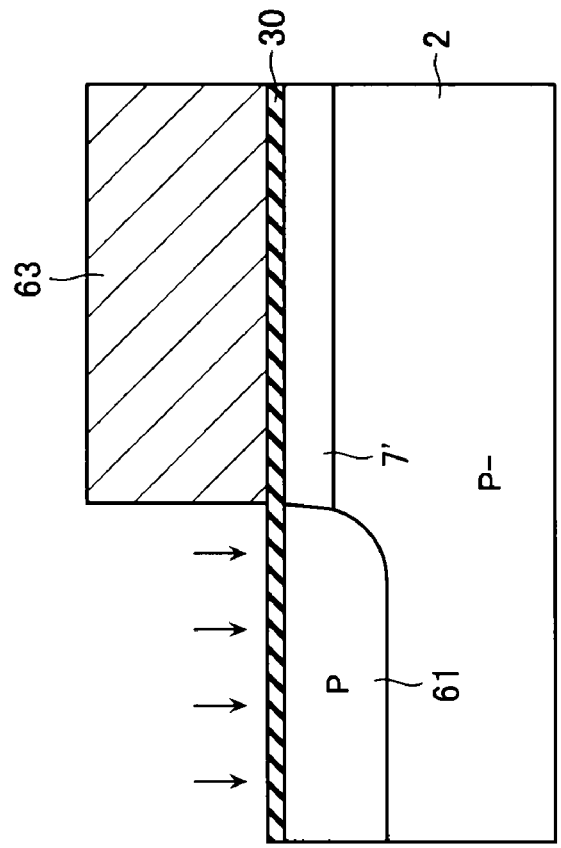
FIG. 6B is a brief cross-sectional view illustrative of the process for manufacturing the semiconductor device according to the second embodiment of the present invention.
Figure 6B:
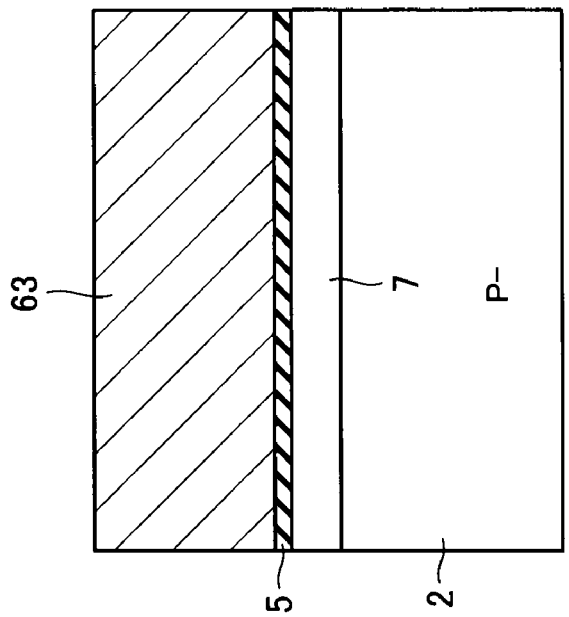

Another method of forming the P-type body region 61 may comprise forming the P-type body region 61 through ion implantation with the use of a mask 63 having an aperture only over the P-type body region 61 in the power MOS transistor 60; then removing the mask 63; and forming the gate electrodes 9, 27 as shown in FIG. 6B.

The subsequent steps are similar to those in the above-described first embodiment and accordingly omitted from the description.

Figure 7:
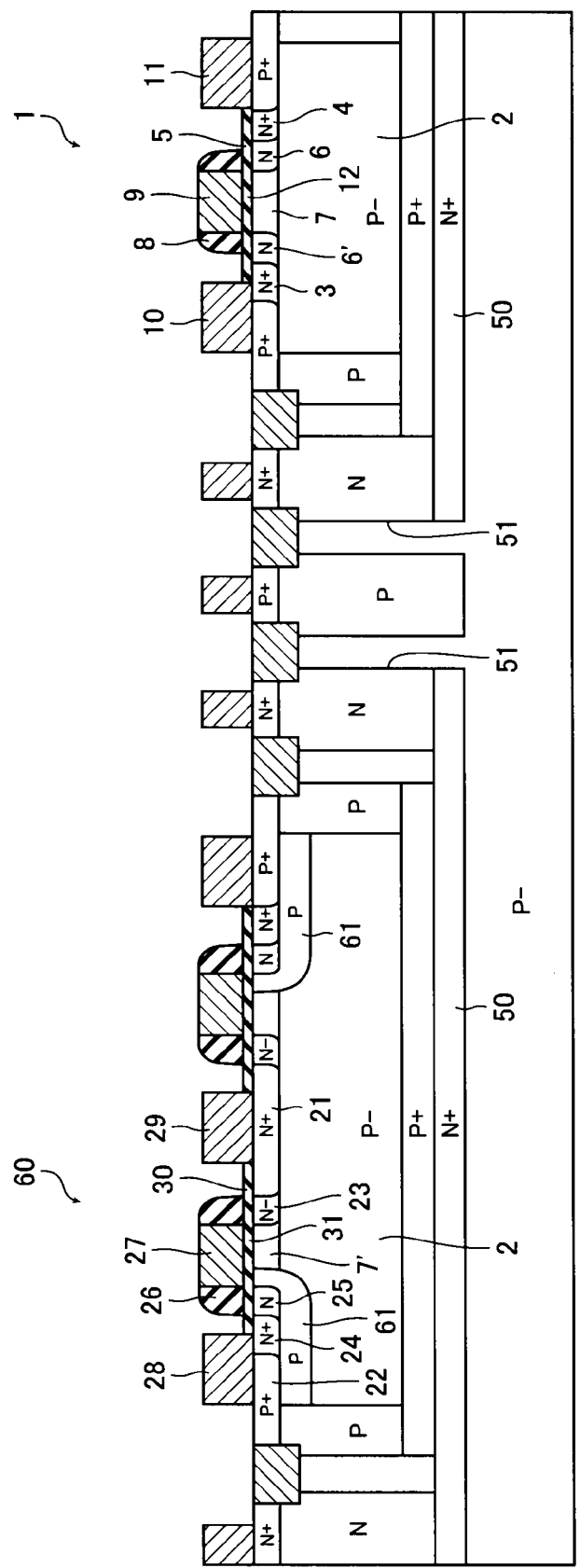
FIG. 7 briefly shows a sectioned structure of the semiconductor device according to the second embodiment of the present invention, which comprises a CMOS transistor and a power MOS transistor in one substrate.

FIG. 7 shows a structural cross-sectional view of the device actually formed in combination through the above-described manufacturing method. The CMOS transistor 1 and the power MOS transistor 60 are formed in the P$^-$-type semiconductor layer 2, which are separated by the N$^+$-type layer 50 and the N-type layer 51 formed in depth, and thus formed separately on the same substrate. The method of separating the CMOS transistor 1 and the power MOS transistor 60 is not limited to this example.

Third Embodiment

Figure 8:
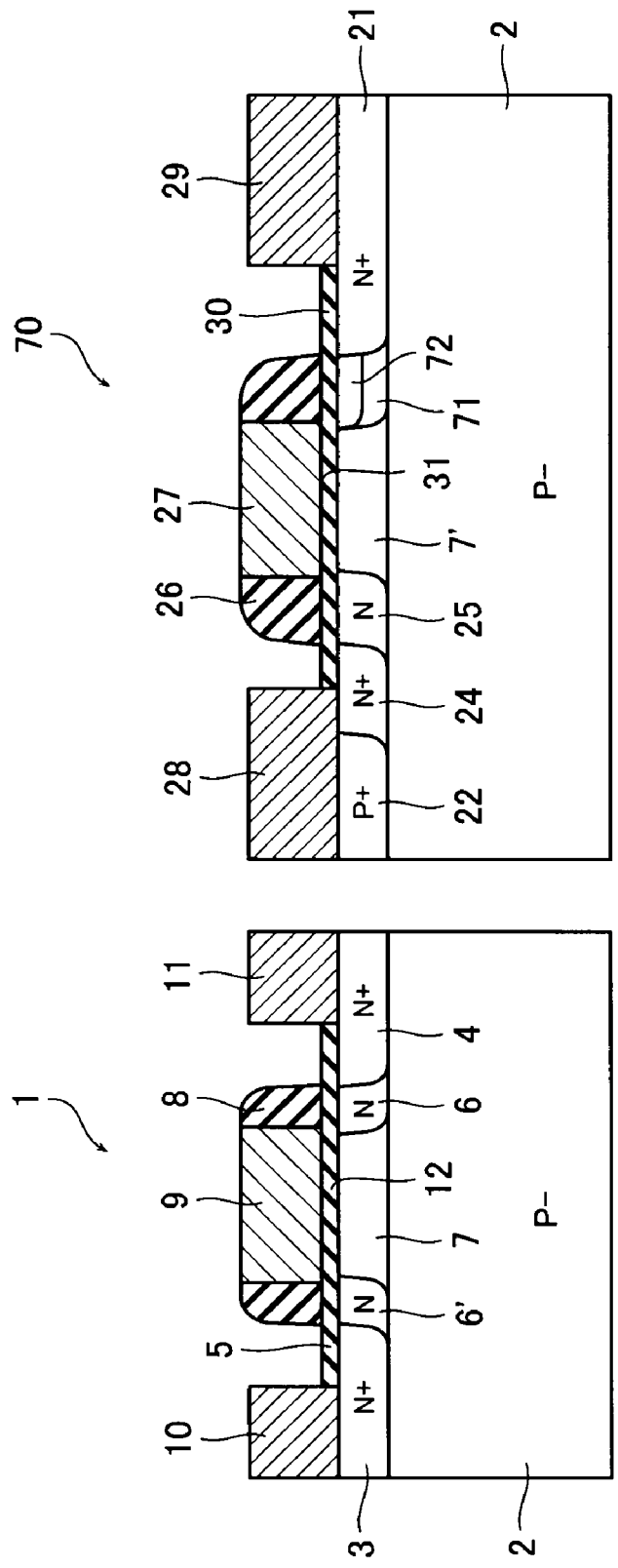
FIG. 8 briefly shows a structural cross-sectional view of a semiconductor device according to a third embodiment of the present invention.

FIG. 8 briefly shows a structural cross-sectional view of a semiconductor device according to the present embodiment. The CMOS transistor region is similar to that in the above-described first embodiment and accordingly omitted from the following description. The power MOS transistor 70 according to the present embodiment has a double-layered structure in the drift region, different from the power MOS transistor 20 in the above-described first embodiment. Formed on the right-hand side (drain side) of the channel 7', that is, on the opposite side of the gate electrode 27 from the LDD region 25 is a double-layer structured drift region having different impurity concentrations in depth.

In the present embodiment, for convenience in describing, the drift region has a structure of double layers, which are hereinafter referred to as a first drift region 71 and a second drift region 72 for convenience.

With regard to the depth, the first drift region 71 is formed at a deeper position than the second drift region 72. The first drift region 71 is of the same conductivity type (N$^-$-type) as the LDD region 25. With regard to the depth, the second drift region 72 is formed at a shallower position than the first drift region 71. The second drift region 72 is of the same conductivity type (N$^-$-type) as the first drift region 71 and formed at an impurity dose lower than or equal to that in the first drift region 71. The drift regions 71, 72 have lateral lengths of 0.1-0.2 µm in accordance with the width of the sidewall 26.

As a result, the drift region including the first drift region 71 and the second drift region 72 has an impurity distribution that exhibits a lower concentration in the substrate surface region and a higher concentration at a deeper position. In such the drift region, it is not depleted uniformly from the gate side of the drift region in the lateral direction but the lower-concentration surface region is depleted earlier when a reverse bias is applied to the device. Accordingly, the electric field across the gate and the drift region can be relieved, and it is made possible to prevent the device from breaking down at the drift end region and deteriorating the reliability of the gate oxide.

A method of manufacturing the semiconductor device according to the present embodiment is described with reference to the drawings. The CMOS transistor region is similar to that in the first embodiment and accordingly omitted from the following description.

First, the channel region 7' is formed through certain ion implantation in the P$^-$-type semiconductor layer 2, and then the gate electrode 27 is formed as shown in FIG. 3A.

Next, a photolithography technology is used, and then ions of phosphorous (P) or the like are implanted into the substrate on the left-hand side (source side) of the gate electrode 27 at implantation energy of 50-70 KeV and a dose of around $10^{14}$ cm$^{-2}$. Thus, the N$^+$-type diffused region or the LDD region 25 is formed. Next, a photolithography technology is used, and then ions of phosphorous (P) or the like are implanted into the substrate on the right-hand side (drain side) of the gate electrode 27 at implantation energy of 30-200 KeV and a dose of $2.0\times10^{12}$ cm$^{-2}$ to $5.0\times10^{13}$ cm$^{-2}$. Thus, the N$^+$-type diffused region or the first drift region 71 is formed. The acceleration voltage for ion implantation can be adjusted to form a first drift region 71 having a peak of the concentration profile at a desired depth.

Subsequently, with the use of the same photoresist mask, ions of phosphorous (P) or the like are implanted into the substrate at implantation energy of 5-20 KeV and a dose of $1\times10^{12}$ cm$^{-2}$ to $1\times10^{13}$ cm$^{-2}$. Thus, the N$^+$-type diffused region or the second drift region 72 is formed. The acceleration voltage for ion implantation can be lowered than the step of forming the first drift region 71, thereby forming the second drift region 72 having a peak of the concentration profile in the vicinity of the surface of the P$^-$-type semiconductor layer 2.

The first drift region 71 and the second drift region 72 may be of the same conductivity type and are not required to be of the same ion type. Therefore, these drift regions may be formed through ion implantation of arsenic (As) into the second drift region 72 and phosphorous (P) into the first drift region 71.

The subsequent steps are similar to those in the above-described first embodiment and accordingly omitted from the description.

Others

The embodiments of the invention have been described above though the present invention is not limited to these but rather can be given various modifications, additions and so forth without departing from the scope and spirit of the invention. For example, the insulator films contained in the sidewall of the power MOS transistor are not limited to three layers but may be formed of more than three films stacked.

What is claimed is:

1. A semiconductor device, comprising a first transistor and a second transistor formed in a semiconductor layer,
said first transistor including:
a first gate electrode formed on said semiconductor layer via a first insulator;
a first source region formed in said semiconductor layer in relation to said first gate electrode; and
a first drain region formed in said semiconductor layer to sandwich the first gate electrode with said first source region,
said second transistor including:
a second gate electrode formed on said semiconductor layer via a second insulator;
a second source region formed in said semiconductor layer in relation to said second gate electrode;
an LDD region formed in said semiconductor layer and adjacent to said second source region;
a drift region formed in said semiconductor layer to sandwich said second gate electrode with said LDD region, the drift region having a lower impurity concentration than that of the LDD region; and
a second drain region formed in said semiconductor layer and adjacent to said drift region to sandwich the second gate electrode with said second source region,
wherein said first gate electrode has a first sidewall formed on sides thereof and said second gate electrode has a second sidewall formed on sides thereof, wherein the width of said first sidewall along said first insulator differs from the width of said second sidewall along said second insulator, and
most part of said drift region is formed in a region under said second sidewall.

2. The semiconductor device according to claim 1, wherein said first sidewall and said second sidewall are composed of multi-layered film structure, respectively.

3. The semiconductor device according to claim 2, wherein said second sidewall includes more stacked films by one or more than said first sidewall.

4. The semiconductor device according to claim 1, wherein said first sidewall and said second sidewall are composed of stacked films of a silicon oxide and a silicon nitride.

5. The semiconductor device according to claim 1, wherein said second sidewall has a structure of a first silicon oxide, a silicon nitride and a second silicon oxide stacked in turn,
wherein said first sidewall has a structure of said first silicon oxide and said silicon nitride stacked in turn.

6. The semiconductor device according to claim 1, wherein said drift region has a lower impurity concentration than said second drain region.

7. The semiconductor device according to claim 1, wherein the width of said second sidewall along said second insulator is larger than the width of said first sidewall along said first insulator.

8. The semiconductor device according to claim 1, said second transistor further including a body region formed to surround said second source region and having a higher impurity concentration than said semiconductor layer, wherein said body region extends to a portion beneath said second gate electrode of said second transistor.

9. The semiconductor device according to claim 7, wherein said first sidewall and said second sidewall are composed of multi-layered film structure, respectively.

10. The semiconductor device according to claim 8, wherein the width of said second sidewall along said second insulator is larger than the width of said first sidewall along said first insulator.

11. The semiconductor device according to claim 10, wherein said first sidewall and said second sidewall are composed of multi-layered film structure, respectively.

12. The semiconductor device according to claim 1, further comprising an LDD region formed in said semiconductor layer, adjacent to said first source region or said first drain region, and under said first sidewall.

* * * * *